(12) United States Patent
Shank et al.

(10) Patent No.: US 11,081,561 B2
(45) Date of Patent: Aug. 3, 2021

(54) FIELD-EFFECT TRANSISTORS WITH VERTICALLY-SERPENTINE GATES

(71) Applicant: GLOBALFOUNDRIES U.S. Inc., Santa Clara, CA (US)

(72) Inventors: Steven M. Shank, Jericho, VT (US); Anthony K. Stamper, Williston, VT (US); Siva P. Adusumilli, South Burlington, VT (US)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 74 days.

(21) Appl. No.: 16/405,469

(22) Filed: May 7, 2019

(65) Prior Publication Data

US 2020/0357892 A1  Nov. 12, 2020

(51) Int. Cl.
| | |
|---|---|
| *H01L 27/12* | (2006.01) |
| *H01L 29/423* | (2006.01) |
| *H01L 27/092* | (2006.01) |
| *H01L 29/06* | (2006.01) |
| *H01L 21/8238* | (2006.01) |

(Continued)

(52) U.S. Cl.
CPC .. *H01L 29/42376* (2013.01); *H01L 21/28114* (2013.01); *H01L 21/823828* (2013.01); *H01L 21/823871* (2013.01); *H01L 21/823878* (2013.01); *H01L 21/84* (2013.01); *H01L 27/092* (2013.01); *H01L 27/1203* (2013.01); *H01L 29/0649* (2013.01); *H01L 29/0692* (2013.01); *H01L 29/41766* (2013.01)

(58) Field of Classification Search
CPC ....... H01L 21/28114; H01L 21/823828; H01L 21/823871; H01L 21/823878; H01L 21/84; H01L 27/092; H01L 27/1203; H01L 29/0649; H01L 29/0692; H01L 29/41766; H01L 29/42376; H01L 21/823481; H01L 21/845; H01L 27/088; H01L 27/1211; H01L 29/7853

See application file for complete search history.

(56) References Cited

U.S. PATENT DOCUMENTS

| | | |
|---|---|---|
| 6,486,511 B1 | 11/2002 | Nathanson et al. |
| 7,589,992 B2 | 9/2009 | Han et al. |

(Continued)

OTHER PUBLICATIONS

Xibo Zhang, Sang Lam, P. K. Ko and Mansun Chan, "High-speed mixed signal and RF circuit design with compact waffle MOSFET," Proceedings 2002 IEEE Hong Kong Electron Devices Meeting (Cat. No. 02TH8616), Hong Kong, China, 2002, pp. 103-106.

(Continued)

*Primary Examiner* — Meiya Li
(74) *Attorney, Agent, or Firm* — Thompson Hine LLP; Anthony Canale (57) ABSTRACT

Structures for a field-effect transistor and methods of forming a field-effect transistor. An isolation region is arranged to surround an active device region, which is composed of a semiconductor material. A trench is arranged in the active device region. The trench includes a bottom surface and a sidewall extending from the bottom surface to a top surface of the active device region. A gate electrode of the field-effect transistor has a first section on the top surface of the active device region, a second section on the bottom surface of the trench, and a third section on the sidewall of the trench.

15 Claims, 7 Drawing Sheets

(51) Int. Cl.
  *H01L 21/28* (2006.01)
  *H01L 21/84* (2006.01)
  *H01L 29/417* (2006.01)

(56) References Cited

U.S. PATENT DOCUMENTS

| | | |
|---|---|---|
| 8,058,161 B2 | 11/2011 | Barna et al. |
| 9,202,906 B2 | 12/2015 | Howell et al. |
| 2014/0048860 A1* | 2/2014 | Mikasa ................. H01L 27/108 257/296 |
| 2014/0151807 A1* | 6/2014 | Chi ..................... H01L 27/1211 257/348 |
| 2016/0284680 A1* | 9/2016 | Yoon ................. H01L 29/41791 |
| 2018/0247956 A1 | 8/2018 | Stamper et al. |

OTHER PUBLICATIONS

Zhigang Wu, Soichiro Honda, Junya Matsui, Katsuyuki Utaka, Tomohiko Edura, Masahide Tokuda, Ken Tsutsui, and Yasuo Wada, "Tunable Monolithic DWDM Band-Selection Interleaver Filter Switch on Silicon-on-Insulator Substrate," J. Lightwave Technol. 26, 3363-3368 (2008).

P. Bakeman, A. Bergendahl, M. Hakey, D. Horak, S. Luce and B. Pierson, "A high performance 16-Mb DRAM technology," Digest of Technical Papers. 1990 Symposium on VLSI Technology, Honolulu, Hawaii, USA, 1990, pp. 11-12.

M. Jaffe et al., "Improvements in SOI technology for RF switches," 2015 IEEE 15th Topical Meeting on Silicon Monolithic Integrated Circuits in RF Systems, San Diego, CA, 2015, pp. 30-32.

\* cited by examiner

FIELD-EFFECT TRANSISTORS WITH VERTICALLY-SERPENTINE GATES

BACKGROUND

The present invention relates to semiconductor device fabrication and integrated circuits and, more specifically, to structures for a field-effect transistor and methods of forming a field-effect transistor.

Device structures for a field-effect transistor generally include a body region, a source and a drain defined in the body region, and a gate electrode configured to switch carrier flow in a channel formed during operation in the body region. When a control voltage exceeding a designated threshold voltage is applied to the gate electrode, carrier flow occurs in the channel between the source and drain to produce a device output current.

Complementary metal-oxide semiconductor (CMOS) circuitry is utilized in mobile communication devices (e.g., laptops, cellular phones, tablets, etc.) to handle wireless high frequency signals transmitted to and/or received by the mobile communication devices. The circuitry on a chip may include a low noise amplifier and a high frequency switch that allows for high frequency signals received by an antenna to be routed from the low noise amplifier to other chip circuitry and for high frequency signals to be routed from a power amplifier to the antenna. The high frequency switch may include a stack or bank of field-effect transistors formed by CMOS processes. In many instances, the bank of field-effect transistors may occupy a large area on the chip.

Improved structures for a field-effect transistor and methods of forming a field-effect transistor are needed.

SUMMARY

In an embodiment, a structure includes an isolation region arranged to surround an active device region that is composed of a semiconductor material and that has a top surface. A trench is arranged in the active device region. The trench includes a bottom surface and a sidewall extending from the bottom surface to the top surface of the active device region. The structure includes a gate electrode having a first section on the top surface of the active device region, a second section on the bottom surface of the trench, and a third section on the sidewall of the trench.

In an embodiment, a method includes forming an isolation region that is arranged to surround an active device region comprised of a semiconductor material and patterning a trench in the active device region. The trench includes a bottom surface and a sidewall extending from the bottom surface to a top surface of the active device region. The method further includes forming a gate electrode having a first section on the top surface of the active device region, a second section on the bottom surface of the trench, and a third section on the sidewall of the trench.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals are used to indicate like features in the various views.

DETAILED DESCRIPTION

With reference to FIGS. 1, 2, 2A, 2B and in accordance with embodiments of the invention, a structure 10 includes trenches 12 that are formed as recesses extending into an active device region 24 of a semiconductor substrate 14. The semiconductor substrate 14 may be a bulk semiconductor wafer composed of a single-crystal semiconductor material, such as single-crystal silicon. Shallow trench isolation regions 22 are formed in a trench that surrounds the active device region 24 in which the trenches 12 are located. The shallow trench isolation regions 22 extend from the top surface 16 of the active device region 24 to a shallow depth, D1, beneath the top surface 16 of the active device region 24. The shallow trench isolation regions 22 may be composed of a dielectric material, such as silicon dioxide, deposited by chemical vapor deposition into trenches etched by a masked etching process, polished, and deglazed.

The trenches 12 are formed in a pattern that distributes the trenches in a two-dimensional array that includes multiple rows 11 and columns 13. Each of the trenches 12 is surrounded by sidewalls 20, 21 defining a boundary at which the elevation changes by an amount equal to the depth of the trench 12. The sidewalls 20, 21 extend from a bottom surface 25 of each trench 12 to the top surface 16 of the active device region 24. In an embodiment, the sidewalls 20, 21 may extend in a vertical direction. In an embodiment, the sidewalls 20, 21 may extend slanted relative to the vertical direction such that each trench 12 is tapered or flared. The pattern of the trenches 12 has a vertically-serpentine shape due to the periodic elevation changes introduced into the semiconductor substrate 14. Each trench 12 has a width dimension, W1, a length dimension, L1, and a bottom surface at a depth, D2, that defines the elevation change between the bottom surface 25 of each trench 12 and the top surface 16 of the active device region 24.

The distribution of the trenches 12 in rows 11 and columns 13 provides sections 18 and strips 27 of the active device region 24 that are arranged about the trenches 12 and that provide an elevation contrast. The strips 27 represent regions of the active device region 24 that are arranged in a lateral direction (e.g., the y-direction) between the different rows 11 of trenches 12. The strips 27 border the sidewalls 21 of the trenches 12. A top surface of each strip 27 is arranged at the elevation of the top surface 16 of the active device region 24, and each strip 27 is arranged laterally between the sidewalls 21 of adjacent rows of the trenches 12.

The sections 18 of the active device region 24 are arranged between different columns 13 of trenches 12. The sections 18 provide raised mesas as regions between adjacent trenches 12 in each row 11. A top surface of each section 18 is at the elevation of the top surface 16 of the active device region 24, and each section 18 is arranged laterally between the sidewalls 20 of an adjacent pair of trenches 12. Each section 18 has a width dimension, W2. The sections 18 of the active device region 24 provide bridges in the top surface 16 that extend across and interrupt the continuity of the different rows 11 of trenches 12, and also connect the strips 27 arranged between adjacent rows 11 of trenches 12.

The trenches 12 may be formed by lithography and etching processes in the active device region 24. To that end, an etch mask may be formed by lithography over the semiconductor substrate 14. The etch mask may include a layer of, for example, an organic photoresist that is applied by a spin coating process, pre-baked, exposed to light projected through a photomask, baked after exposure, and developed with a chemical developer to define openings at the intended locations of the trenches 12. The photoresist may be reflowed to round sharp corners. An etching process is used to remove the semiconductor material of the active device region 24 over areas exposed by the etch mask and is controlled to provide a given trench depth resulting in the vertically-serpentine pattern. The size and arrangement of the openings in the etch mask determine the dimensions and locations of the sections 18 and strips 27 of the active device region 24.

In an embodiment, the trenches 12 may be formed after the shallow trench isolation regions 22. In an embodiment, the trenches 12 may be formed before the shallow trench isolation regions 22 are formed and then masked during the formation of the shallow trench isolation regions 22. In an embodiment, the trenches 12 and the trenches for the shallow trench isolation regions 22 may be concurrently patterned such the depth of the trenches 12 is substantially equal to the depth of the trenches for the shallow trench isolation regions 22. The dielectric material is deposited in the trenches 12 and the trenches for the shallow trench isolation regions 22, and is then removed from the trenches 12 with a masked etch.

A well (not shown) may be formed in the active device region 24 after the formation of the trenches 12. The well may be provided by ion implanting a dopant having a given conductivity type, such as boron to provide the well with p-type conductivity.

Figure 1:
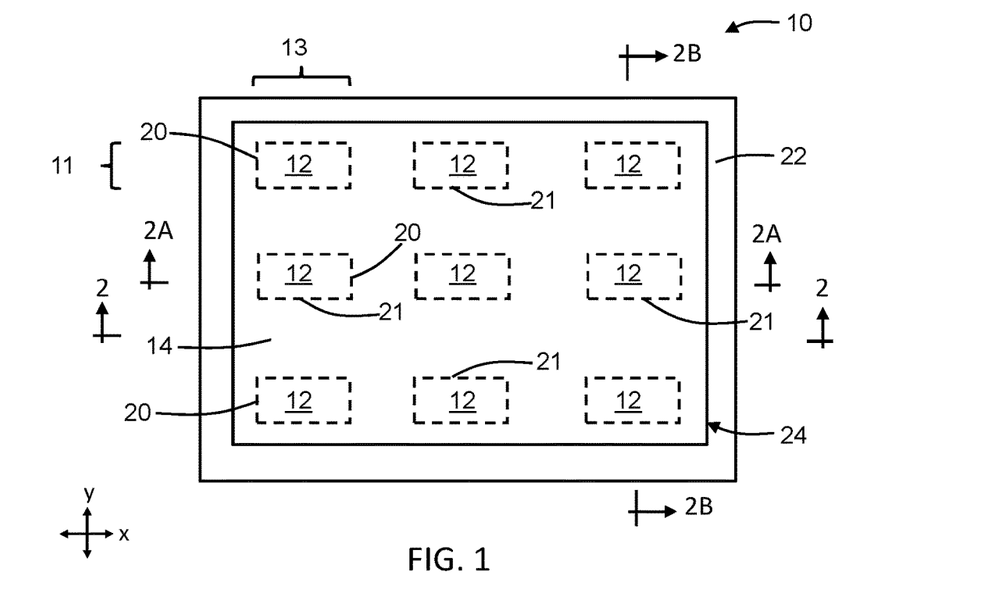
FIG. 1 is a top view of a device structure at an initial fabrication stage of a processing method in accordance with embodiments of the invention.
Figure 2:
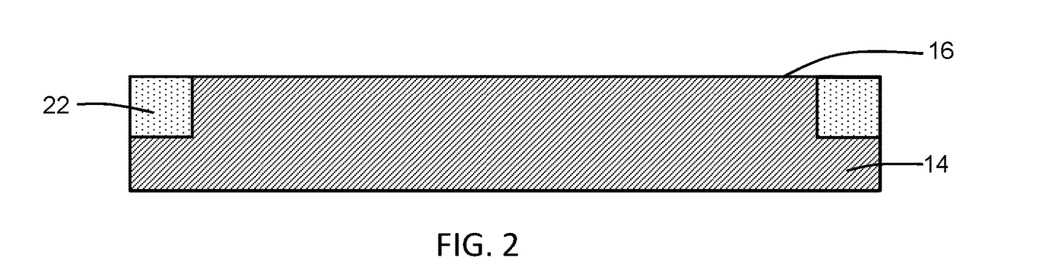
FIG. 2 is a cross-sectional view taken generally along line 2-2 in FIG. 1.
Figure 2A:
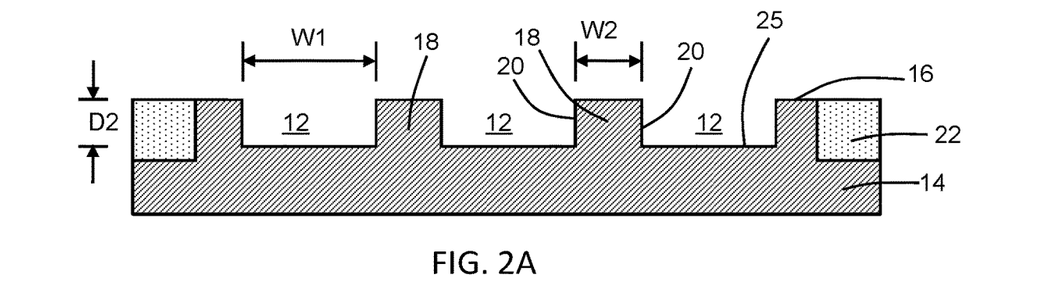
FIG. 2A is a cross-sectional view taken generally along line 2A-2A in FIG. 1.
Figure 2B:
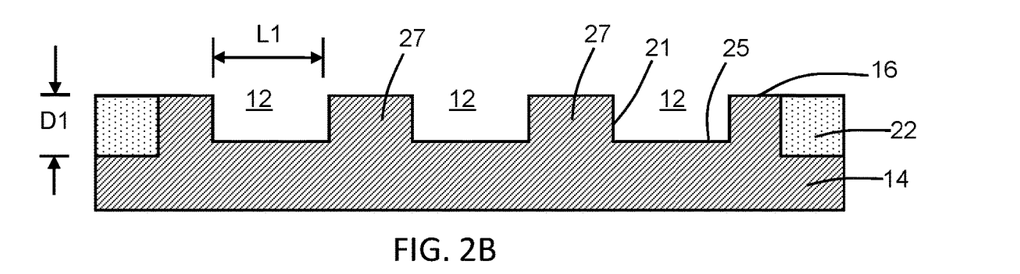
FIG. 2B is a cross-sectional view taken generally along line 2B-2B in FIG. 1.
Figure 3:
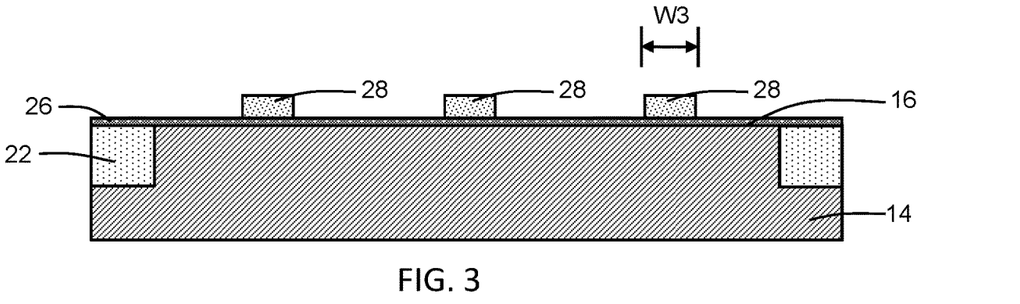
FIGS. 3, 3A, and 3B are cross-sectional views of the device structure at a fabrication stage subsequent to FIGS. 2, 2A, 2B.
Figure 3A:
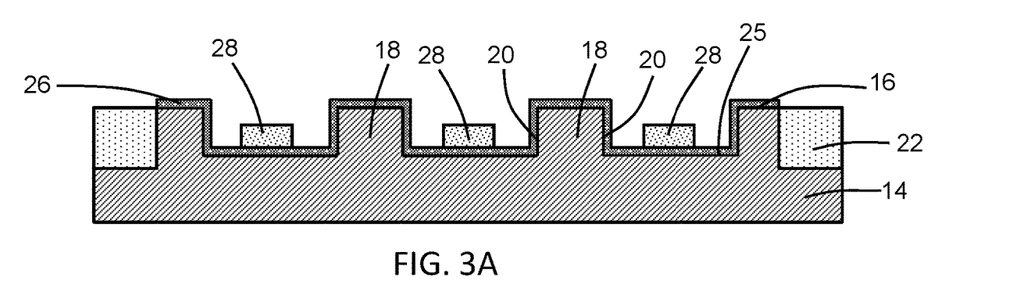
Figure 3B:
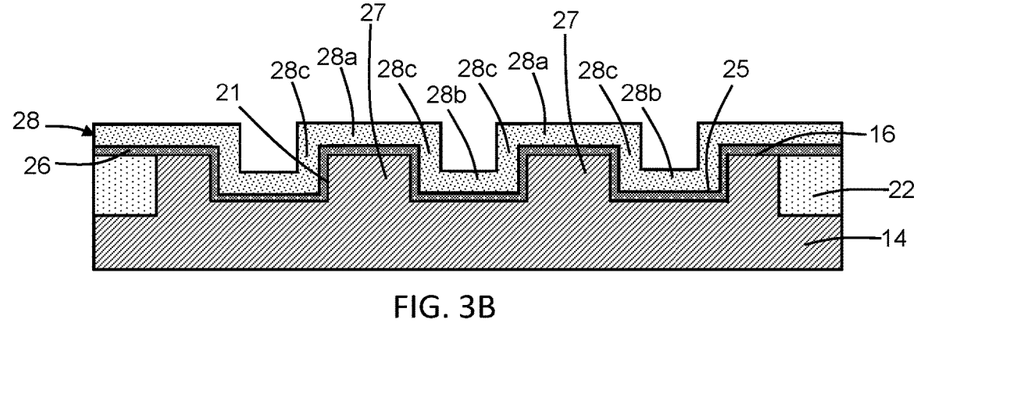

With reference to FIGS. 3, 3A, 3B in which like reference numerals refer to like features in FIGS. 2, 2A, 2B and at a subsequent fabrication stage, a gate dielectric layer 26 is formed over the top surface 16 of the active device region 24. The gate dielectric layer 26 may be composed of a dielectric material, such as silicon dioxide grown by a wet or dry thermal oxidation process of the semiconductor material of the active device region 24 or silicon dioxide deposited by atomic layer deposition. The gate dielectric layer 26 conformally follows the contour generated by the trenches 12.

Gate electrodes 28 are formed as a set of fingers by patterning a deposited layer with photolithography and etching. The gate electrodes 28 may be composed of a doped polycrystalline semiconductor material, such as doped polycrystalline silicon (i.e., polysilicon), that is deposited over the gate dielectric layer 26 and patterned. The gate electrodes 28 may be aligned parallel or substantially parallel to each other. The gate electrodes 28 are aligned transverse to the rows 11 (FIG. 1) of trenches 12 and are aligned parallel to the columns 13 (FIG. 1) of trenches 12. The gate electrodes 28 may have a width dimension, W3, that is less than the width dimension, W1, of the trenches 12 such that the gate electrodes 28 do not overlap with the sidewalls 20 of the trenches 12, but instead only overlap with the sidewalls 21 of the trenches 12.

The gate electrodes 28 includes multiple sections 28a, 28b, 28c that are respectively arranged on the top surface 16 of the active device region 24, the bottom surface 25 of each trench 12, and the sidewalls 21 of each trench 12 bordering the strips 27. In following the contour, the gate electrodes 28 adopt the vertically-serpentine pattern of the trenches 12. As best shown in FIG. 3B, the gate electrodes 28 includes sections 28a that are arranged on the top surface 16 of the active device region 24 between the rows 11 of trenches 12, sections 28b on the bottom surface 25 of each trench 12, and sections 28c that are arranged to extend along the sidewall 21 on opposite sides of each trench 12. The sections 28a of the gate electrodes 28 arranged on the top surface 16 of the active device region 24 are at a different level than the sections 28b of the gate electrodes 28 arranged on the bottom surface 25 of each trench 12. Each section 28c connects one of the sections 28a with one of the sections 28b such that the gate electrodes 28 are electrically continuous.

Halos and source/drain extensions (not shown) may be formed in the active device region 24 after the formation of the gate electrodes 28. The halos and source/drain extensions may be formed by ion implantation of one or more dopants having given conductivity types.

Figure 4:
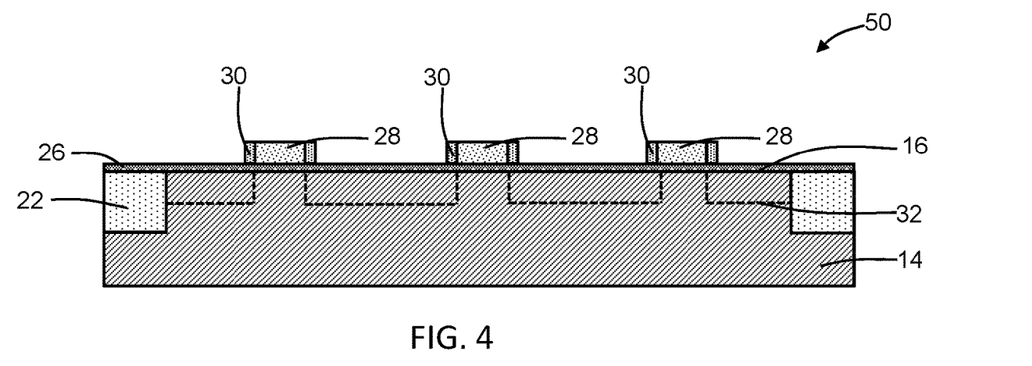
FIGS. 4, 4A, and 4B are cross-sectional views of the device structure at a fabrication stage subsequent to FIGS. 3, 3A, 3B.
Figure 4A:
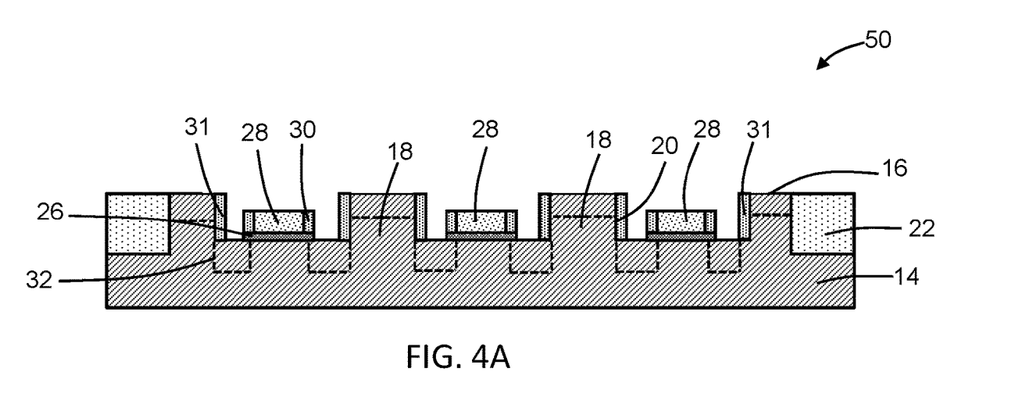
Figure 4B:
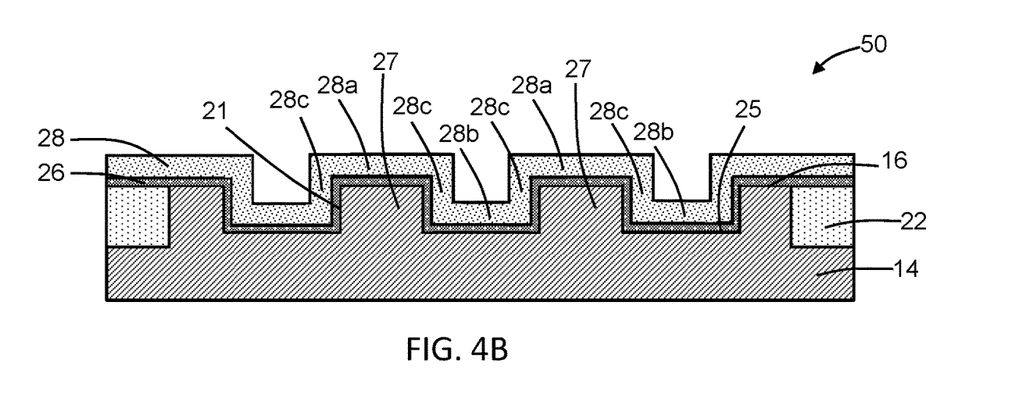

With reference to FIGS. 4, 4A, 4B in which like reference numerals refer to like features in FIGS. 3, 3A, 3B and at a subsequent fabrication stage, sidewall spacers 30 are formed at the sidewalls of the gate electrodes 28, and sidewall spacers 31 are formed at the sidewalls 20 of the trenches 12. The sidewall spacers 30, 31 may be formed by depositing a conformal layer composed of a dielectric material, such as silicon dioxide, with atomic layer deposition and etching the deposited layer with an anisotropic etching process, such as reactive ion etching.

Source/drain regions 32 of a given conductivity type are formed in the active device region 24 adjacent to, and on opposite sides of, each spacer-clad gate electrode 28 following the formation of the sidewall spacers 30. The source/drain regions 32 are formed beneath the bottom surface 25 of each trenches 12. The sections 18 of the active device region 24 between the spacer-clad gate electrodes 28 are also doped when the source/drain regions 32 are formed. The source/drain regions 32 may be formed by ion implanting a dopant of a given conductivity type, such as arsenic and/or phosphorus to provide n-type conductivity. The dopant may diffuse during subsequent processing and merge such that the different sections 18 are overlapped and connected within the source/drain regions 32.

Figure 5:
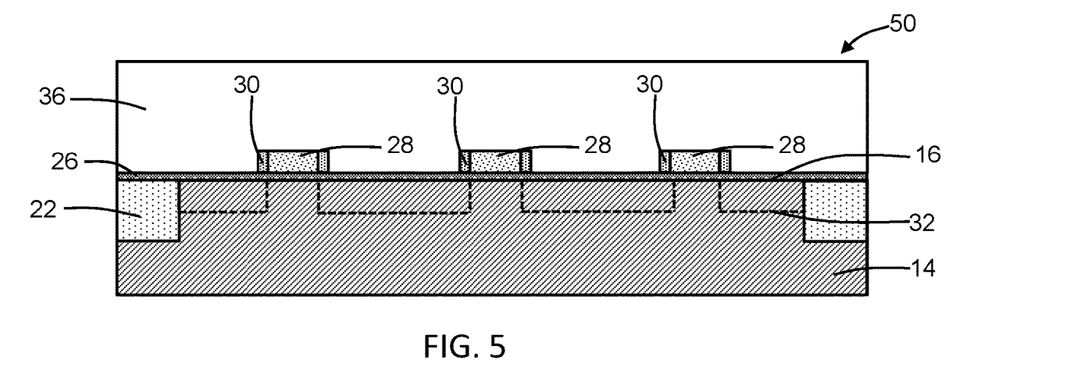
FIGS. 5, 5A, 5B are cross-sectional views of the device structure at a fabrication stage subsequent to FIGS. 4, 4A, and 4B.
Figure 5A:
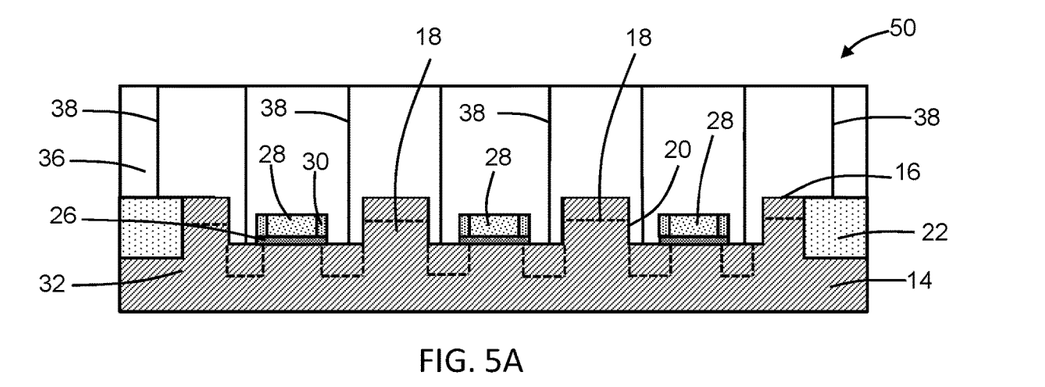
Figure 5B:
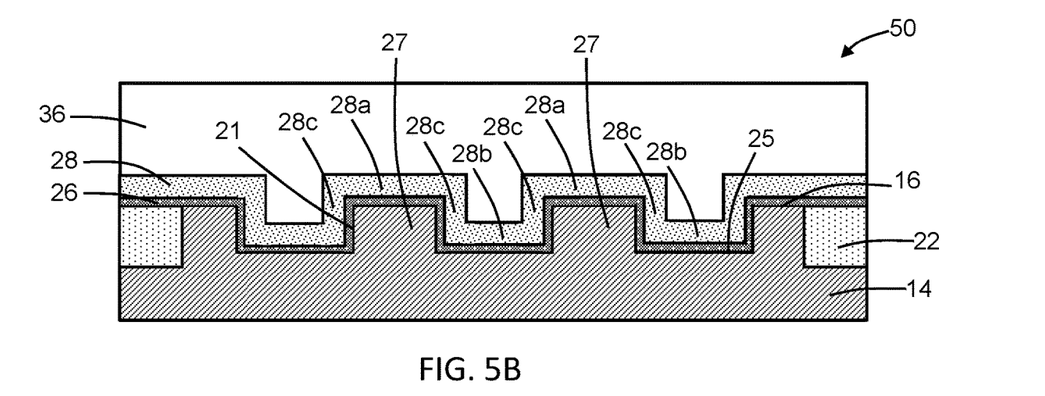
Figure 6:
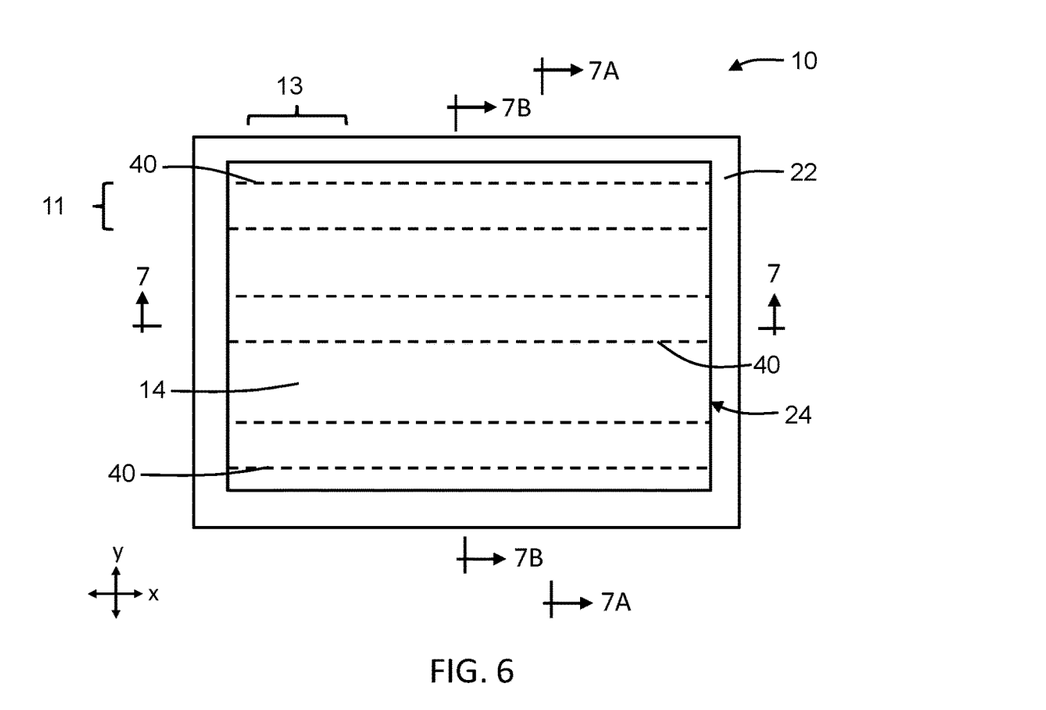
FIG. 6 is a top view of a device structure at an initial fabrication stage of a processing method in accordance with embodiments of the invention.

With reference to FIGS. 5, 5A, 5B in which like reference numerals refer to like features in FIGS. 4, 4A, 4B and at a subsequent fabrication stage, the gate electrodes 28 and the source/drain regions 32 contribute to a device structure having the form of a field-effect transistor 50. The cyclic upward and downward undulation of the gate electrodes 28 across the trenches 12 effectively increases the length of the gate electrodes 28 without increasing the area of the active device region 24. The increase in the length of the gate electrodes 28 may therefore be enabled without changing the contact dimensions or the contact-to-gate electrode minimum spacing in the layout.

Middle-of-line (MOL) processing and back-end-of-line (BEOL) processing follow, which includes formation of silicide, contacts, vias, and wiring for an interconnect structure coupled with the field-effect transistor. The interconnect structure includes a dielectric layer 36 and contacts 38 arranged in contact openings in the dielectric layer 36 as vertical interconnections extending to the source/drain regions 32. The sidewall spacers 31 on the sidewalls 20 of the trenches 12 may be removed when forming the contact openings. The contacts 38 may overlap with and fully cover the sections 18 of the active device region 24. In particular, each contact 38 may overlap with the sidewalls 20 of adjacent trenches 12 such that the sections 18 are fully covered. In an embodiment, the contacts 38 do not have an overlapping relationship with the sidewalls 21 of the trenches 12. The contacts 38 may extend to directly contact the bottom surface 25 of the trench 12 adjacent to a sidewall 20 on one side of each section 18 and to directly contact the bottom surface 25 adjacent to a sidewall 20 on an opposite side of each section 18. Contacts (not shown) connected with the gate electrodes 28 are also formed.

With reference to FIGS. 6, 7, 7A, 7B and in accordance with alternative embodiments, trenches 40 may be formed by lithography and etching processes that replace the trenches 12 of the structure 10. Each of the trenches 40 in the modified structure 10 may have a length, L2, that extends completely across the active device region 24 such that the trenches 40 are inscribed inside the shallow trench isolation regions 22. More specifically, the sidewalls 39 and bottom surface 41 of each trench 40 may extend completely across the active device region 24. The sections 18 of the semiconductor substrate 14 are absent such that the trenches 40 are lengthwise uninterrupted. The trenches 40 are arranged in rows 11, similar to trenches 12, of a one-dimensional array that lacks columns. The sidewalls 39 of the trenches 40 border the strips 27 of the active device region 24, and the strips 27 extend completely across the active device region 24.

Figure 7:
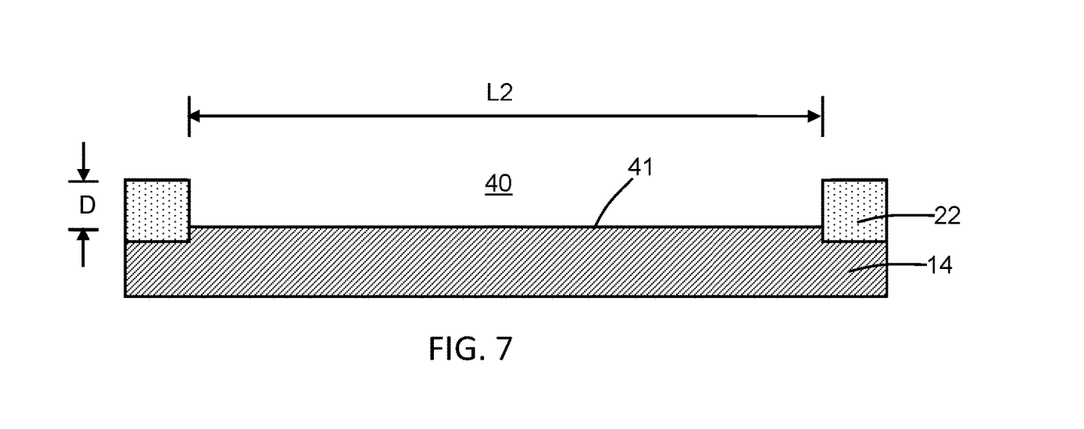
FIG. 7 is a cross-sectional view taken generally along line 7-7 in FIG. 6.
Figure 7A:
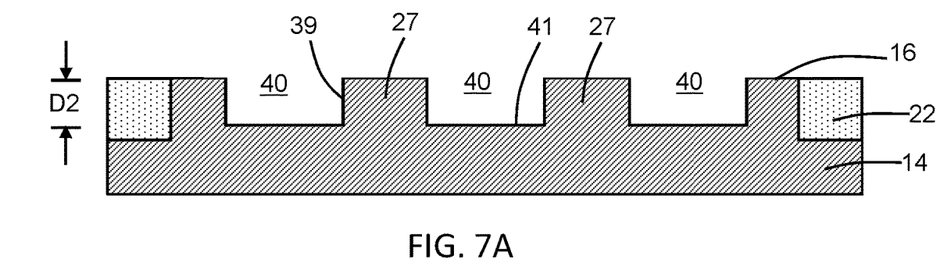
FIG. 7A is a cross-sectional view taken generally along line 7A-7A in FIG. 6.
Figure 7B:
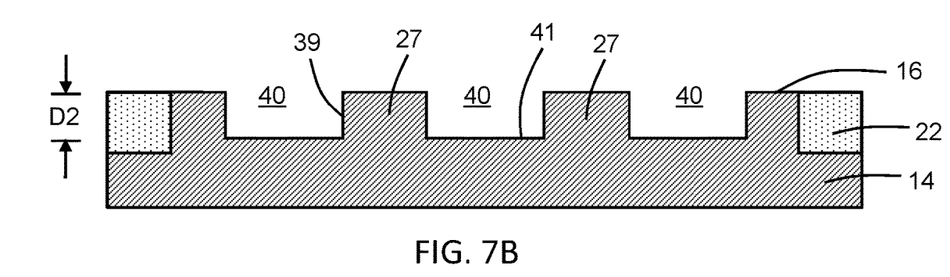
FIG. 7B is a cross-sectional view taken generally along line 7B-7B in FIG. 6.
Figure 8:
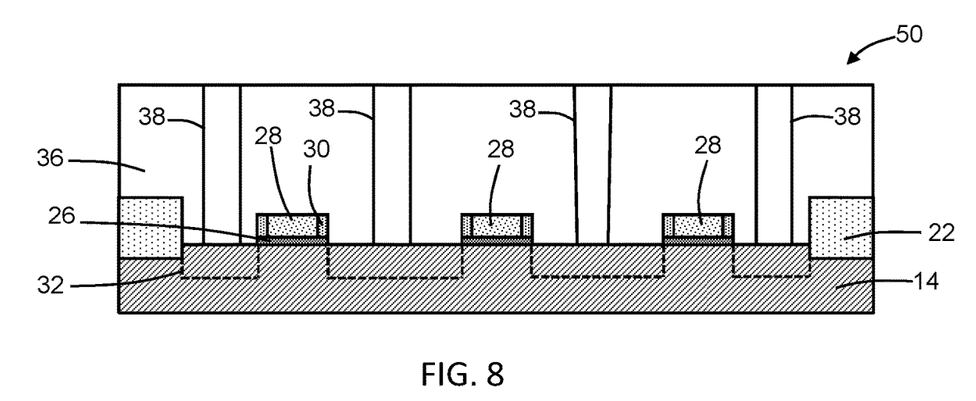
FIGS. 8, 8A, and 8B are cross-sectional views of the device structure at a fabrication stage subsequent to FIGS. 7, 7A, 7B.
Figure 8A:
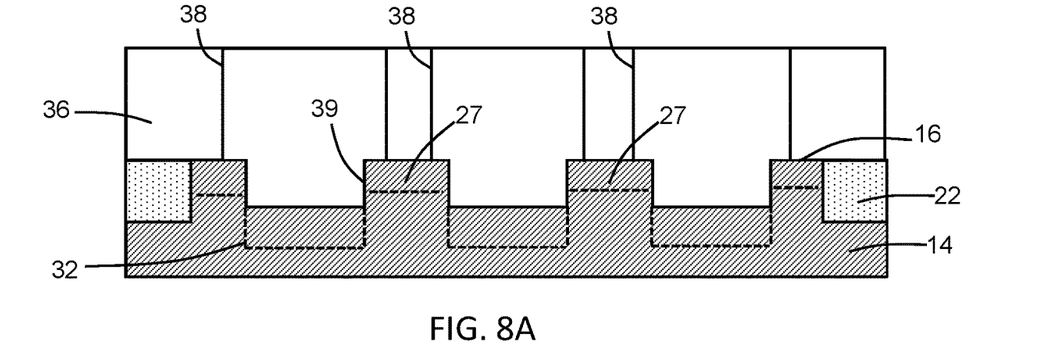
Figure 8B:
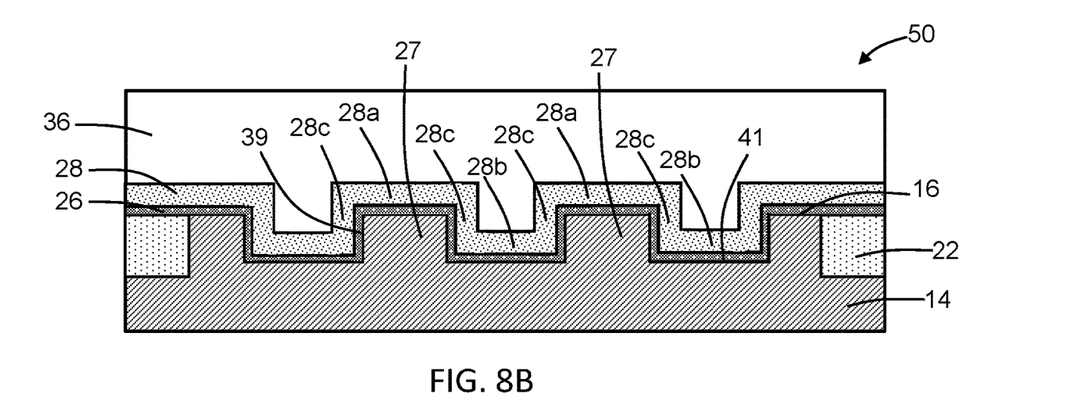

With reference to FIGS. 8, 8A, 8B in which like reference numerals refer to like features in FIGS. 7, 7A, 7B and at a subsequent fabrication stage, processing continues as described in connection with FIGS. 3, 3A, 3B and FIGS. 4, 4A, 4B. The sections 28a, 28b, 28c of the gate electrodes 28 are respectively arranged on the top surface 16 of the active device region 24, the bottom surface 41 of each trench 40, and the sidewalls 39 of each trench 40. In following the contour, the gate electrodes 28 adopt the vertically-serpentine pattern of the trenches 40. The sections 28a of the gate electrodes 28 arranged on the top surface 16 of the active device region 24 are at a different level than the sections 28b of the gate electrodes 28 arranged on the bottom surface 41 of each trench 40. Each section 28c connects one of the sections 28a with one of the sections 28b to provide the gate electrodes 28 with electronical continuity.

Each contact 38 lands in part on the bottom surface 41 of the trench 40. As best shown in FIG. 8A, the contacts 38 also land in part on the top surface 16 of the active device region 24 on opposite sides of the trenches 40 and contact the sidewalls 39 between the bottom surface 41 and the top surface 16. The contacts 38 formed in connection with trenches 40 may be shaped with a different geometry than the contacts 38 formed in connection with the trenches 12 due at least in part to the absence of the sections 18 of the active device region 24.

Figure 9:
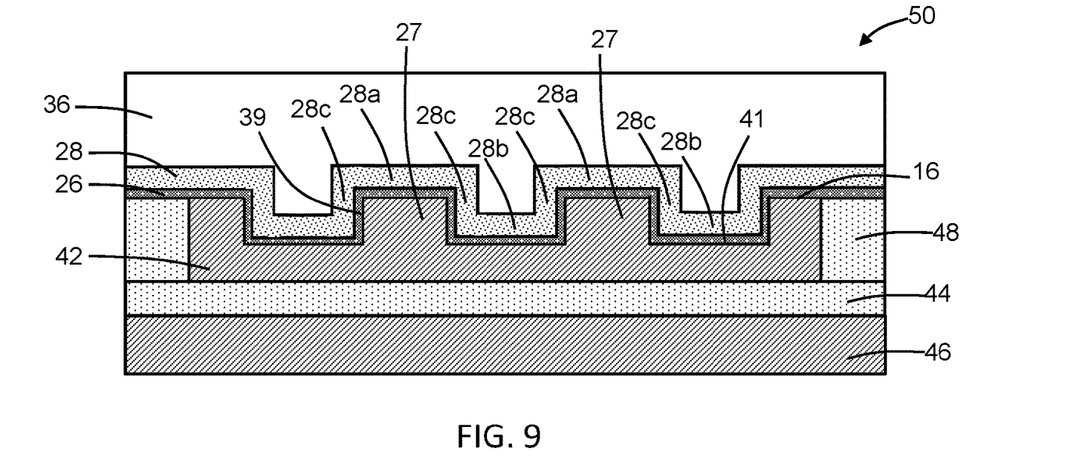
FIG. 9 is a cross-sectional view of a device structure in accordance with alternative embodiments of the invention.

With reference to FIG. 9 in which like reference numerals refer to like features in FIG. 5A and in accordance with alternative embodiments, the field-effect transistor 50 may be fabricated using a semiconductor-on-insulator (SOI) wafer, instead of the semiconductor substrate 14. The SOI wafer includes a device layer 42 used to fabricate the field-effect transistor, a buried insulator layer 44 in the form of a buried oxide (BOX) layer, and a substrate 46. The device layer 42 is separated from the substrate 46 by the intervening buried insulator layer 44 and is considerably thinner than the substrate 46. The device layer 42 and the substrate 46 may be composed of a single-crystal semiconductor material, such as single-crystal silicon. In an embodiment, the device layer 42 may have a thickness that ranges from about 3 nanometers (nm) to about 200 nm. In an embodiment, the SOI wafer may be an extremely thin semiconductor-on-insulator (ETSOI) wafer with a thin device layer 42 and a thin buried insulator layer 44, and may be used to fabricate the field-effect transistor 50 as a fully-depleted SOI (FDSOI) device. In an embodiment, the device layer 42 of the ETSOI wafer may have a thickness in an ultra-thin regime (i.e., about 3 nm to about 10 nm) suitable to manufacture FDSOI devices. A mesa isolation region 48 may extend through the full thickness of the device layer 42 to provide isolation for the active device region in which the field-effect transistor 50 is formed.

In conjunction with the formation of the field-effect transistor 50, the trenches 40 may be formed within the active device region in a two-dimensional array, as described previously. The trenches 40 are etched to only extend partially through the device layer 42. A thinned section of the device layer 42 is arranged between the bottom surfaces 41 of the trenches 40 and the buried insulator layer 44. Alternatively and as also described previously, the trenches 12 may be formed within the active device region in a two-dimensional array, and a thinned section of the device layer may be arranged between the bottom surfaces 25 of the trenches 12 and the buried insulator layer 44.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or "in direct contact with" another feature if intervening features are absent. A feature may be "indirectly on" or "in indirect contact with" another feature if at least one intervening feature is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure, comprising:
    an active device region comprised of a semiconductor material, the active device region including a top surface, a first trench defining a first recess in the semiconductor material, and a second trench defining a second recess in the semiconductor material, the first trench including a first bottom surface and a first sidewall extending from the first bottom surface to the top surface, and the second trench including a second bottom surface and a second sidewall extending from the second bottom surface to the top surface;
    a plurality of shallow trench isolation regions arranged to surround the active device region, the first trench, and the second trench;
    a first gate electrode having a first section on the semiconductor material at the top surface of the active device region, a second section on the semiconductor material at the first bottom surface of the first trench, and a third section on the semiconductor material at the first sidewall of the first trench; and
    a second gate electrode having a first section on the semiconductor material at the top surface of the active device region, a second section on the semiconductor material at the second bottom surface of the second trench, and a third section on the semiconductor material at the second sidewall of the second trench,
    wherein the second gate electrode is arranged substantially parallel to the first gate electrode.

2. The structure of claim 1, wherein the active device region includes a section laterally arranged between the first sidewall of the first trench and the second sidewall of the second trench.

3. The structure of claim 2, further comprising:
    a source/drain region laterally arranged between the first gate electrode and the second gate electrode,
    wherein the source/drain region is arranged beneath the first bottom surface of the first trench and the second bottom surface of the second trench.

4. The structure of claim 3, further comprising:
    a contact connected with the source/drain region, the contact arranged to overlap with the first sidewall of the first trench and to overlap with the second sidewall of the second trench such that the contact is arranged fully over the section of the active device region.

5. The structure of claim 4, wherein the contact is in direct contact with the first bottom surface of the first trench, and the contact is in direct contact with the second bottom surface of the second trench.

6. The structure of claim 1, wherein the active device region includes a strip arranged between the first sidewall of the first trench and the second sidewall of the second trench, and further comprising:
    a source/drain region laterally arranged in the first trench adjacent to the first gate electrode; and
    a contact connected with the source/drain region, the contact arranged to overlap with the first sidewall of the first trench, the second sidewall of the second trench, and the strip of the active device region.

7. The structure of claim 6, wherein the contact is in direct contact with the first bottom surface of the first trench, and the contact is in direct contact with the second bottom surface of the second trench.

8. The structure of claim 1, wherein the active device region includes a strip arranged between the first sidewall of the first trench and the second sidewall of the second trench, and the first section of the first gate electrode and the first section of the second gate electrode extend extends across the strip of the active device region.

9. The structure of claim 1, wherein the active device region is a section of a bulk semiconductor wafer, the first bottom surface of the first trench is arranged at a first depth, and each of the plurality of shallow trench isolation regions is arranged in a third trench having a second depth in the bulk semiconductor wafer.

10. The structure of claim 9, wherein the first depth is substantially equal to the second depth is greater than the first depth.

11. The structure of claim 1, wherein the active device region is a section of a device layer of a semiconductor-on-insulator wafer, and each of the plurality of shallow trench isolation regions extends through a full thickness of the device layer.

12. The structure of claim 11, wherein the first trench only extends partially through the device layer.

13. A method, comprising:
    patterning a first trench defining a first recess in a semiconductor material of an active device region, wherein the first trench includes a first bottom surface and a first sidewall extending from the first bottom surface to a top surface of the active device region;
    patterning a second trench defining a second recess in the semiconductor material of the active device region, wherein the second trench includes a second bottom surface and a second sidewall extending from the second bottom surface to the top surface of the active device region;

forming a plurality of shallow trench isolation regions that are arranged to surround the active device region, the first trench, and the second trench;

forming a first gate electrode having a first section on the top surface of the active device region, a second section on the first bottom surface of the first trench, and a third section on the first sidewall of the first trench; and forming a second gate electrode having a first section on the top surface of the active device region, a second section on the second bottom surface of the second trench, and a third section on the second sidewall of the second trench, wherein the second gate electrode is arranged substantially parallel to the first gate electrode.

14. The method of claim 13, wherein the active device region includes a section laterally arranged between the first sidewall of the first trench and the second sidewall of the second trench.

15. The method of claim 13, wherein the active device region includes a strip arranged between the first sidewall of the first trench and the second sidewall of the second trench, and the first section of the first gate electrode and the first section of the second gate electrode extend extends across the strip of the active device region.

* * * * *

UNITED STATES PATENT AND TRADEMARK OFFICE
CERTIFICATE OF CORRECTION

PATENT NO. : 11,081,561 B2  
APPLICATION NO. : 16/405469  
DATED : August 3, 2021  
INVENTOR(S) : Steven M. Shank et al.

Page 1 of 1

It is certified that error appears in the above-identified patent and that said Letters Patent is hereby corrected as shown below:

In the Claims

Column 8, Claim 8, Line 40, after "extend" delete "extends"  
Column 9, Claim 15, Line 26, after "extend" delete "extends"

Signed and Sealed this  
Fourteenth Day of September, 2021

Drew Hirshfeld  
*Performing the Functions and Duties of the*  
*Under Secretary of Commerce for Intellectual Property and*  
*Director of the United States Patent and Trademark Office*